United States Patent
Nagai (10) Patent No.: US 6,177,714 B1
(45) Date of Patent: *Jan. 23, 2001

(54) SEMICONDUCTOR DEVICE HAVING A FUSE OF THE LASER MAKE-LINK PROGRAMMING TYPE

(75) Inventor: Nobutaka Nagai, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/023,185

(22) Filed: Feb. 13, 1998

(30) Foreign Application Priority Data

Feb. 14, 1997 (JP) .................................... 9-030309

(51) Int. Cl.[7] .................................................. H01L 29/00
(52) U.S. Cl. ........................ 257/529; 257/635; 257/639; 257/644
(58) Field of Search ................................. 257/529, 530, 257/209, 635, 639, 644

(56) References Cited

U.S. PATENT DOCUMENTS

| | | | |
|---|---|---|---|
| 4,455,495 | * 6/1984 | Masuhara et al. | 257/529 |
| 4,561,906 | * 12/1985 | CAlder et al. | 257/530 |
| 4,665,295 | 5/1987 | McDavid | 219/121 LM |
| 4,751,197 | 6/1988 | Wills | 437/174 |
| 4,835,118 | * 5/1989 | Jones, Jr. et al. | 257/530 |
| 4,912,066 | 3/1990 | Wills | 437/173 |
| 4,947,020 | * 8/1990 | Imamura et al. | 257/530 |
| 4,968,643 | * 11/1990 | Mukai | 257/529 |
| 5,166,556 | 11/1992 | Hsu et al. | 307/465 |
| 5,412,593 | 5/1995 | Magel et al. | 365/96 |
| 5,636,172 | * 6/1997 | Prall et al. | 257/529 |
| 5,652,169 | * 7/1997 | Jun | 257/530 |
| 5,789,794 | * 8/1998 | Froehner | 257/529 |
| 5,861,325 | * 1/1999 | Bernstein | 438/131 |

FOREIGN PATENT DOCUMENTS

| | | | |
|---|---|---|---|
| 52-28280 | * 3/1977 | (JP) | 257/529 |
| 61-93643 | 5/1986 | (JP) . | |
| 5-13702 | 1/1993 | (JP) . | |

OTHER PUBLICATIONS

J. A. Yasaitis et al., "Low Resistance Laser Formed Lateral Links," *IEEE Electrdon Device Letters*, vol. EDL–3 No. 7 (Jul. 1982) pp. 184–186.*

* cited by examiner

*Primary Examiner*—J. Carroll
(74) *Attorney, Agent, or Firm*—Foley & Lardner (57) ABSTRACT

In a laser beam make-link programmable semiconductor device, a pair of conductor strips are formed in the same level plane on a lower level insulator film formed on a semiconductor substrate, and are separated from each other in such a manner that opposing ends of the pair of conductor strips are separated by a predetermined distance smaller than a film thickness of the upper level insulator film. An upper level insulator film substantially transparent to a laser beam, is formed on the conductor strips. With this arrangement, even if a trimming laser beam has a small energy, the laser beam permeates through the upper level insulator film to reach and melt the opposing ends of the pair of conductor strips, with the result that the opposing ends of the pair of conductor strips are short-circuited.

9 Claims, 6 Drawing Sheets

SEMICONDUCTOR DEVICE HAVING A FUSE OF THE LASER MAKE-LINK PROGRAMMING TYPE

BACKGROUND OF THE INVENTION

1. Field of the Invention

The present invention relates to a semiconductor device having a fuse used in a laser trimming, and more specifically to a semiconductor device having a fuse of the laser make-link programming type which causes an electrical short-circuit between two conductor films.

2. Description of Related Art

In the prior art, when a semiconductor memory such as DRAM (dynamic random access memory) having a large memory capacity is manufactured, a redundant circuit used for substituting normal parts for faulty parts generated in the manufacturing process is previously formed in the semiconductor memory. The redundant circuit includes fuses used for the substitution after manufactured. In addition, in a field programmable gate array (FPGA), in order to give a user's programmability in connection with function and operation, programmable fuses are provided. In the prior art, as this fuse, there is used a construction of breaking or cutting the conductor in a conductive condition (break-link), or another construction of short-circuiting a pair of conductors in an open-circuit condition (make-link).

Figure 1A:
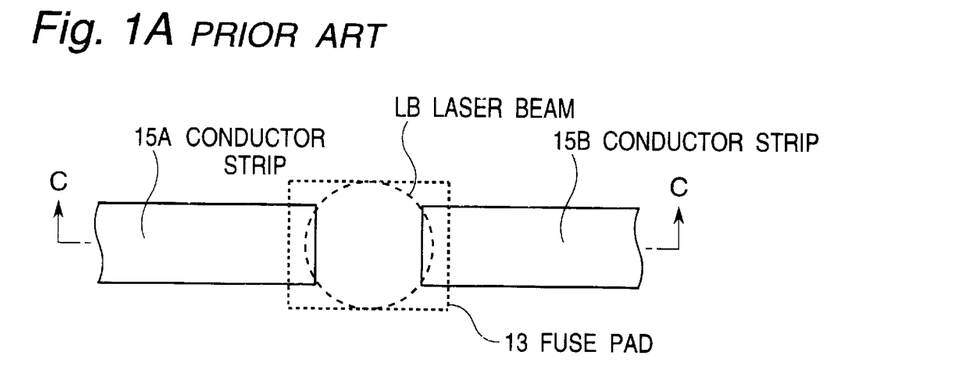
FIG. 1A is a diagrammatic plan view of one example of the prior art make-link type fuse.
Figure 1B:
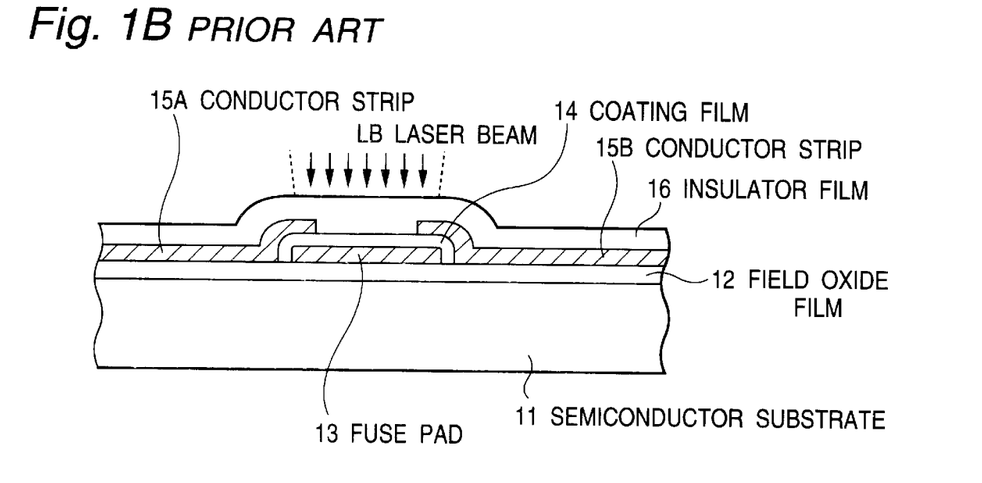
FIG. 1B is a diagrammatic sectional view taken along the line C—C in FIG. 1A.

Referring to FIGS. 1A and 1B, there are shown a plan view of one example of the prior art make-link type fuse, and a section view taken along the line C—C in FIG. 1A, which is disclosed in Japanese Patent Application Pre-examination Publication No. JP-A-61-93643, the content of which is incorporated by reference in its entirety into this application. This JP-A-61-93643 claims Convention Priorities based in two U.S. patent applications, from which there have now issued U.S. Pat. Nos. 4,665,295, 4,751,197 and 4,912,066, the content of which are incorporated by reference in its entirety into this application. In the shown example, a fuse pad 13 of polysilicon is formed on a field oxide film 12 formed on a semiconductor substrate 11, and a thermal oxidation film 14 having a thickness of about 2000 Å is coated on the fuse pad 13. Conductor strips 15A and 15B of polysilicon are formed on the thermal oxidation coating film 14 and the field oxide film 12, separately from each other by a gap positioned above the fuse pad 13. Furthermore, a relatively thick silicon dioxide or phosphosilicate glass insulator film 16 is formed to over the conductor strips 15A and 15B, the coating film 14 and the field oxide film 12.

Figure 1C:
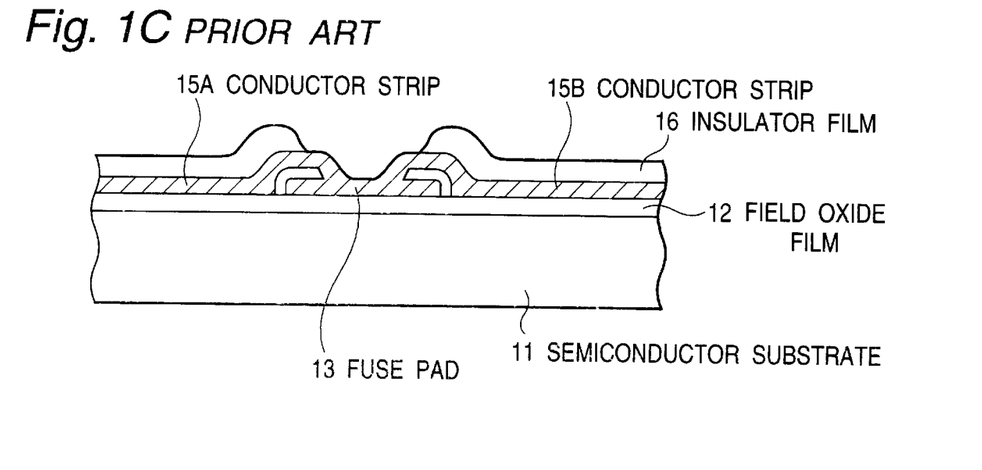
FIG. 1C is a view similar to FIG. 1B, but illustrating a short-circuited condition of the prior art make-link type fuse.

In order to short-circuit this fuse by a laser beam, a laser beam LB is focused on the fuse pad 13, as shown in FIG. 1B. As a result, the laser beam LB first removes the insulator film 16 hit with an incident laser beam spot by encroachment, as shown in FIG. 1C, and then, melts the conductive material of the end of the conductor strips 15A and 15B and the fuse pad 13. The molten conductive material of the conductor strips 15A and 15B and the fuse pad flows onto a side surface of a hole formed in the coating film 14, with the result that the conductor strips 15A and 15B are electrically connected to each other through the fuse pad 13, as shown in FIG. 1C.

Figure 2:
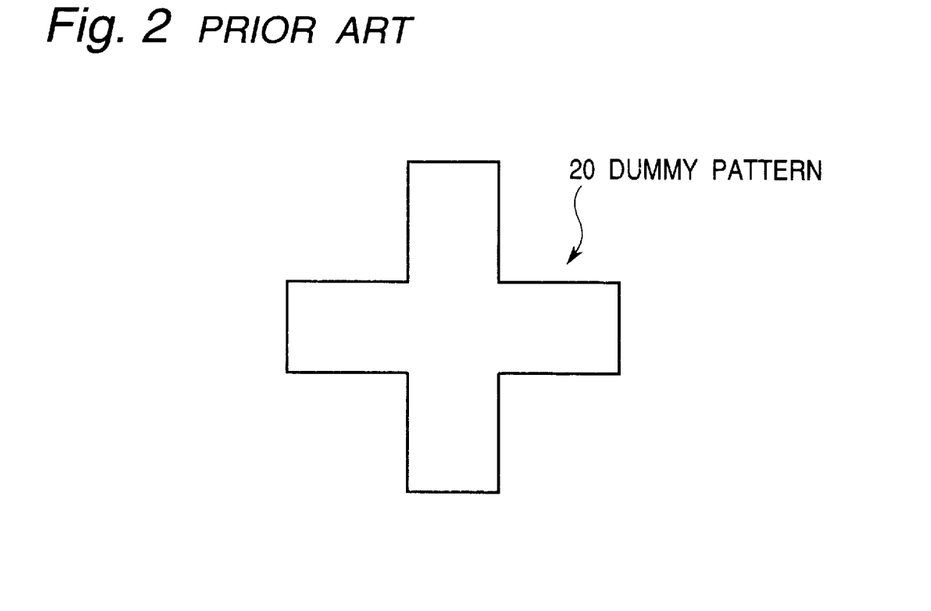
FIG. 2 is a diagrammatic plan view illustrating the prior art dummy pattern.

Incidentally, in order to shorten a laser application time required for the make-link, it is some case that only an uppermost level insulator film on the fuse is removed by a mask used for photolithography and an etching process. In addition, in order to set the condition for the laser beam on the a product chip, a unique dummy pattern 20 having the shape of a cross as shown in FIG. 2 is formed of the same material as that of the fuse, and the laser beam is irradiated onto the crossed portion of the pattern 20. On the basis of a break condition, the laser beam used at a trimming is adjusted. Furthermore, when fuses are arranged in the form of an array, portions to be trimmed are located in a vertical or horizontal straight line.

The following problems have been encountered in the above mentioned prior art fuse.

A first problem is that many steps are required for forming the fuse. Namely, only in order to form the fuse, a conventional process is added with the step for forming the fuse pad 13, and the step for forming the coating film 14 for electrically separating the fuse pad 13 from the two conductor strips 15A and 15B.

A second problem is that after the fuse is trimmed by the laser beam, the wiring conductor is eroded with moisture or another. The reason for this is that, after the laser beam was irradiated onto the fuse, since the relatively thick insulator layer of silicon dioxide on the fuse has been removed by the encroachment due to the laser beam or by the etching process, the fuse is exposed.

A third problem is that when a number of fuses are arranged side by side, a large area is required. The reason for this is that, since the fuse pad has a size larger than the width of the conductor strips 15A and 15B, when a number of fuses having the same shape are arranged side by side, an interval between adjacent fuses must be increased by a difference between the size of the fuse pad and the width of the conductor strip.

A fourth problem is that, in a multilayer interconnection structure using an aluminum wiring conductor or others, the fuse formed at a lower level near to the semiconductor substrate cannot be trimmed by the laser beam with a high degree of yield. The reason for this is that because the insulator film on the fuse becomes thick in the multilayer interconnection structure, the laser beam is weakened until the laser beam reaches to the fuse, with the result that a satisfactory trimming cannot be achieved. In addition, in the case that the thickness of an insulator film under the fuse or a spacing between adjacent fuses is thinner or narrower than the thickness of the insulator film on the fuse, if the trimming is carried out by using a laser beam having energy sufficient to trim the fuse through the thick insulator film on the fuse, a fuse short-circuits with a conductor under the insulator film under the fuse or the adjacent fuse.

A fifth problem is that, when the fuse is trimmed on a product chip, a working efficiency for the laser trimming is low, since it is necessary to first trim the dummy pattern 20 having a unique shape as shown in FIG 2, and then to visually inspect the result of the trimming to determine the optimum condition of the laser trimming such as the energy of the laser beam.

SUMMARY OF THE INVENTION

Accordingly, it is an object of the present invention to provide a semiconductor device having a fuse of the laser make-link programming type, which has overcome the above mentioned defects of the conventional one.

Another object of the present invention is to provide a semiconductor device having a fuse of the laser make-link programming type, which can be formed by a less number of forming steps and which can be trimmed with a reduced energy of laser beam.

Still another object of the present invention is to provide a semiconductor device having a fuse of the laser make-link programming type, which can be incorporated in a semiconductor device with a high integration density, which has high reliability after the trimming, and which can precisely determine the optimum condition for the laser beam used for the trimming.

The above and other objects of the present invention are achieved in accordance with the present invention by a laser beam make-link programmable semiconductor device comprising a lower level insulator film formed on a semiconductor substrate, a pair of conductor films formed in the same level plane on the lower level insulator film and having an end thereof separated from an opposing end of the other by a predetermined distance, and an upper level insulator film substantially transparent to a laser beam, formed on the conductor films, the predetermined distance being smaller than a film thickness of the upper level insulator film.

Preferably, the opposing ends of the pair of conductor films has a unique shape in a plan view. With this arrangement, the opposing area of the opposing ends of the pair of conductor films can be made large.

Furthermore, the semiconductor device can include a light shielding film having a poor laser permeability, formed at a position under the opposing ends of the pair of conductor films.

Alternatively, the semiconductor device can include an upper layer having a poor coverage and formed to cover the opposing ends of the pair of conductor films.

In one embodiment of the semiconductor device, there are formed on the lower level insulator film a plurality of pairs of conductor films, each pair of conductor films having an end thereof separated from an opposing end of the other by a predetermined distance, the plurality of pairs of conductor films being arranged side by side, the opposing ends of the plurality of conductor films being located in a staggered fashion in a plan view.

In another embodiment of the semiconductor device, a check pattern is formed of the same material as that of the conductor films, in the same plan view shape as that of the conductor films, so that the check pattern is used for electrically test whether or not a trimming has properly been carried out at the opposing ends of the pair of conductor films.

There are also provided, according to other embodiments of the invention, a method for producing the semiconductor device and a method for making a link in the semiconductor device.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the make-link type fuse in accordance with the present invention will be described with reference to the accompanying drawings.

Figure 3A:
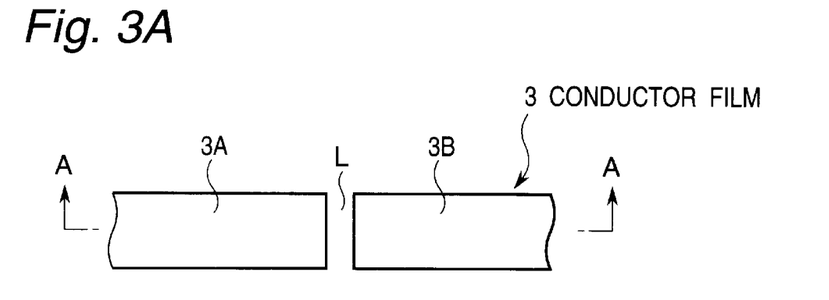
FIG. 3A is a diagrammatic plan view of one embodiment of the make-link type fuse in accordance with the present invention.
Figure 3B:
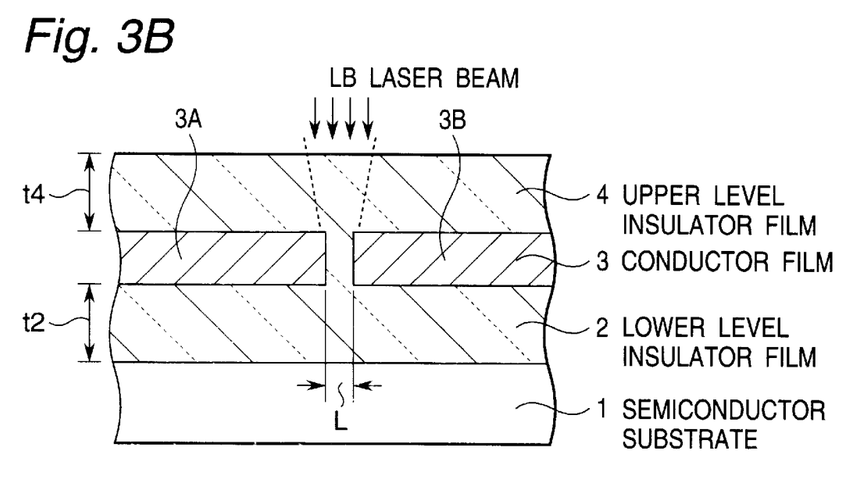
FIG. 3B is a diagrammatic sectional view taken along the line A—A in FIG. 3A.
Figure 3C:
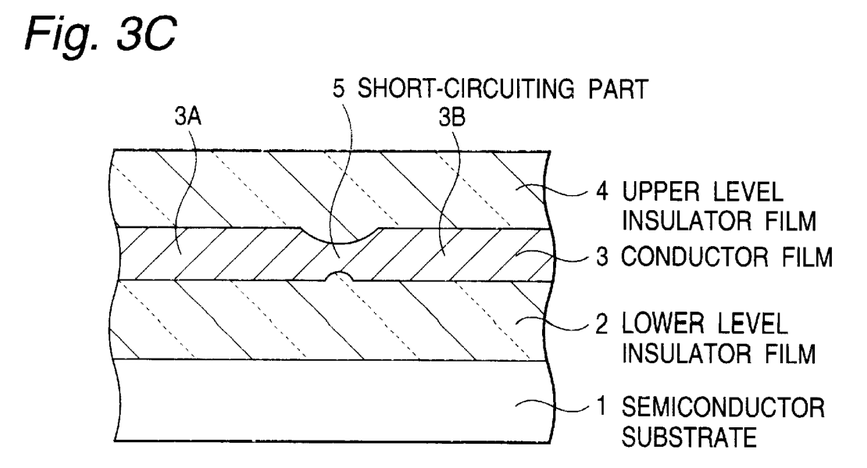
FIG. 3C is a view similar to FIG. 3B, but illustrating a short-circuited condition of the make-link type fuse shown in FIGS. 3A and 3B.

Referring to FIG. 3A, there is shown a diagrammatic plan view of one embodiment of the make-link type fuse in accordance with the present invention. FIG. 3B is a diagrammatic sectional view taken along the line A—A in FIG. 3A.

The first embodiment of the make-link type fuse in accordance with the present invention includes a lower level insulator film 2 formed on a semiconductor substrate 1, and a conductor film 3 formed in a predetermined pattern on the lower level insulator film 2. This conductor film 2 includes a pair of conductor strips 3A and 3B formed in the same level plane and having an end thereof separated from an opposing end of the other by a predetermined distance "L". Furthermore, an upper level insulator film 4 is formed to cover the conductor film 3.

The semiconductor substrate 1 can be constituted of a P type or N type silicon substrate, or an epitaxially grown silicon layer, or a silicon compound semiconductor substrate, or an arbitrary one. The lower level insulator film 2 can be formed of a film of the glass including BPSG (borophosphosilicate glass), PSF (phosphosilicate glass) and NSG (non-doped silicate glass), a nitride film, or a SiON film. The conductor film 3 can be formed of aluminum, tungsten, polysilicon, amorphous silicon, gold, copper, platinum, titanium, or cobalt, or a multilayered structure formed of at least two of these materials, or a mixed material of at least two of these materials. The upper level insulator film 4 can be formed of a film of the glass including BPSG, PSG and NSG, a nitride film, or a SiON film. The upper level insulator film 4 is substantially transparent to a laser beam, as will be described hereinafter.

In this construction, furthermore, the thickness of the conductor film 3 is on the order of 100 Å to 3 μm, and the opposing distance "L" between the opposing ends of the conductor strips 3A and 3B is on the order of 10 Å to 3 μm, and is determined to be smaller than the film thickness $t_2$ and $t_4$ of the upper and lower level insulator films 2 and 4. Here, it is important that the distance "L" is smaller than the film thickness $t_4$ of the upper level insulator film 4. For example, the lower level insulator film 2 is formed of a PSG glass film having a thickness of 10000 Å, the conductor film 3 is formed of a aluminum wiring conductor having a thickness of 5000 Å and a width of 1 μm, and the opposing distance "L" is 0.3 μm, and the upper level insulator film 4 is formed of a NSG film having a thickness of 1 μm.

With this arrangement, at a trimming, namely, at the time of short-circuiting the opposing conductor strips 3A and 3B, a laser beam LB is focused or irradiated onto an opposing end region from a position above the upper level insulator film 4, as shown in FIG. 3B. If the laser beam LB permeates through the upper level insulator film 4 to reach the opposing ends of the conductor strips 3A and 3B, the opposing ends of the conductor strips 3A and 3B are molten so that a short-circuiting part 5 is formed between the conductor strips 3A and 3B, with the result that the conductor strips 3A and 3B are short-circuited. At this time, since the opposing distance "L" between the conductor strips 3A and 3B is smaller than the thickness $t_4$ of the upper level insulator film 4, even if the laser beam energy is small, the laser beam LB reaches the conductor film 3 and melts the conductor film 3, with the result that the above mentioned trimming can be achieved. In addition, in this trimming, since the upper level insulator film 4 on the conductor film 3 is not removed, it is possible to prevent entering of moisture or others, which had occurred in the prior art because the upper level insulator film on the fuse was removed. Therefore, there no longer exists a cause for the drop of reliability caused by erosion of aluminum consisting the conductor film 3. Namely, reliability can be raised.

Figure 4A:
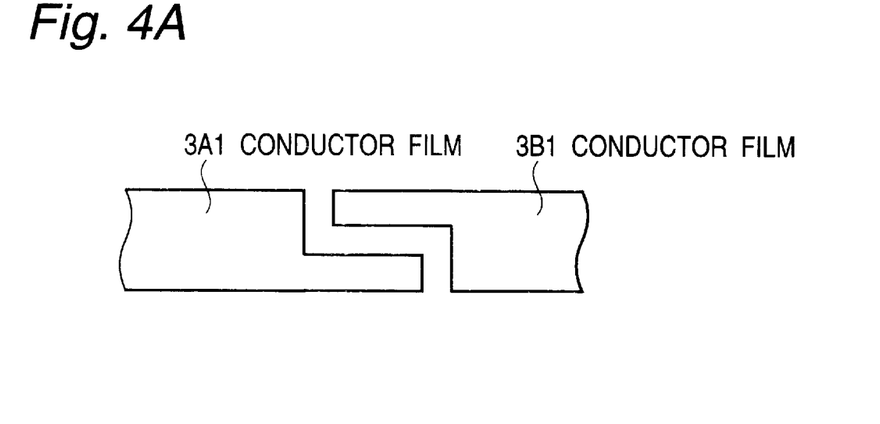
FIGS. 4A, 4B and 4C are diagrammatic plan views illustrating different plan view patterns of the opposing ends of a pair of conductor strips.
Figure 4B:
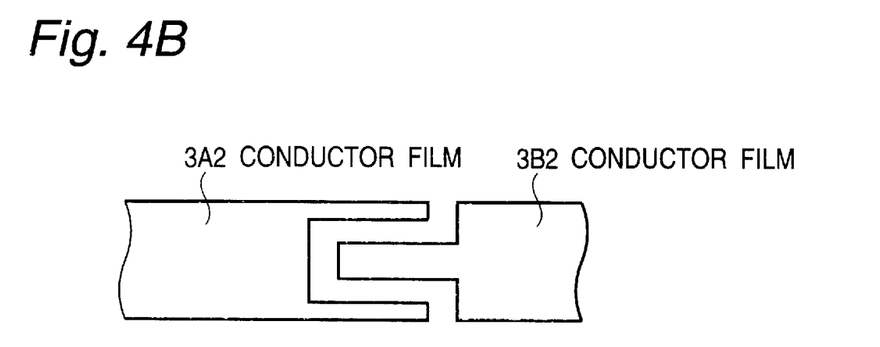
Figure 4C:
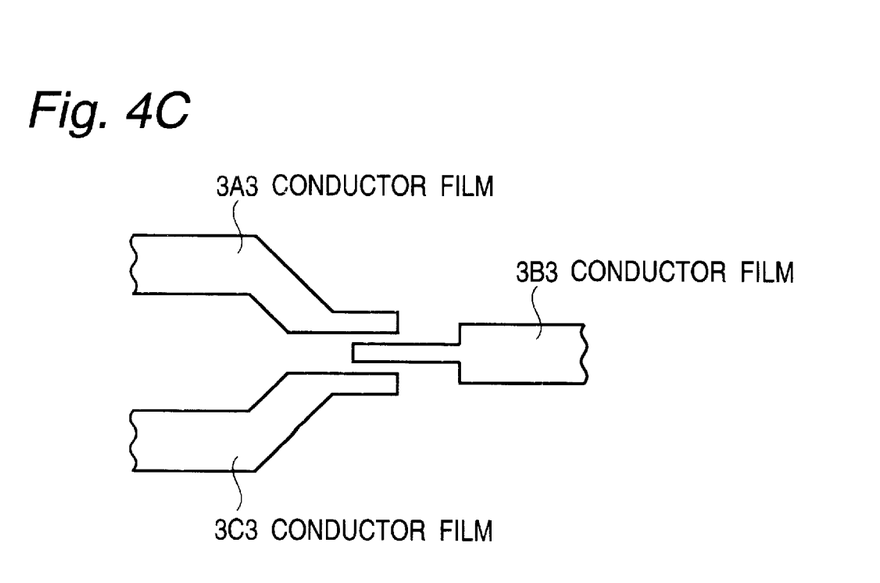

Furthermore, if the opposing area of the opposing ends of the conductor strips 3A and 3B is increased, namely, assuming that the film thickness of the conductor strips 3A and 3B is at constant, if the length of the opposing side or edge of the opposing ends of the conductor strips 3A and 3B in a plan view is increased to a possible extent, the above mentioned trimming can be achieved with the laser beam having a reduced energy. For example, as shown in FIG. 4A, a plan view shape of the opposing ends of a pair of conductor strips 3A1 and 3B1 is formed in a crank shape. Alternatively, as shown in FIG. 4B, the opposing end of one 3A2 of a pair of conductor strips 3A2 and 3B2 is formed to have a U-shape in a plan view, and the opposing end of the other conductor strip 3B2 is formed to have a reverse-T shape in plan view, substantially complementary to the U-shape. With these shapes, the opposing area of the opposing ends of the conductor strips 3A and 3B can be made remarkably larger than a simple cross-sectional area of the conductor strips, so that the above mentioned trimming can be easily carried out. In addition, opposing ends of three conductor strips 3A3, 3B3 and 3C3 or more can be located in plan view as shown in FIG. 4C, if these ends come within a spot of the laser beam. In this case, the opposing ends of the conductor strips 3A3, 3B3 and 3C3 are formed to have a narrowed width, so that the respective opposing ends can be easily molten.

Figure 5:
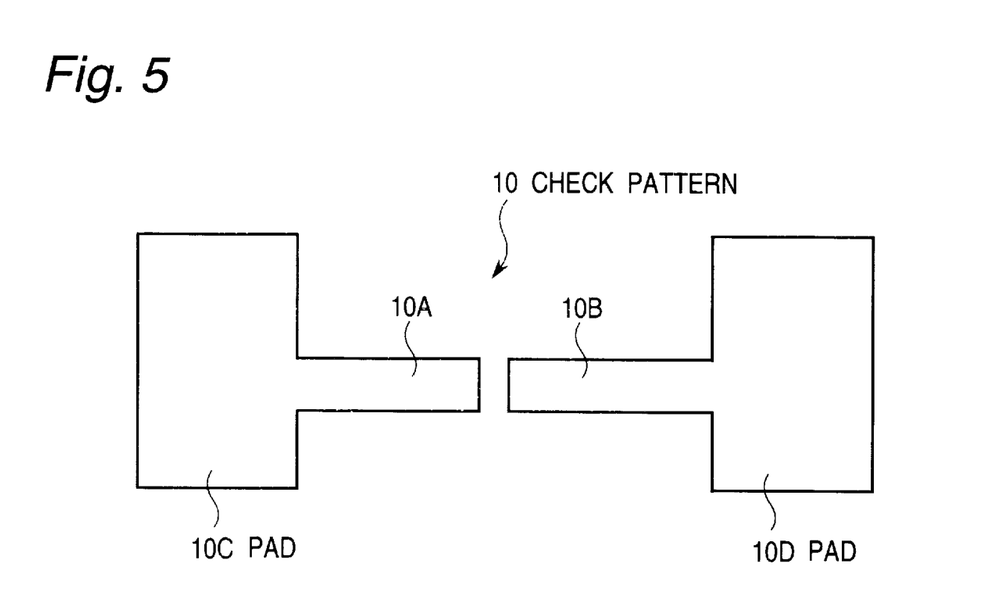
FIG. 5 is a diagrammatic plan view illustrating a check pattern of the fuse.

Referring to FIG. 5, there is shown a diagrammatic plan view illustrating a check pattern of the fuse. The shown check pattern is generally designated with Reference Numeral 10, and is formed of the same material as that of the conductor film 3 (aluminum in this embodiment) and has the same plan view pattern as that of the fuse (3A and 3B). This check pattern 10 is formed on a portion of the semiconductor substrate 1. Respective conductor strips 10A and 10B of the check pattern 10 are formed integrally with contact pads 10C and 10D, respectively, which are configured to be able to be contacted with probes of a tester.

This test pattern is used as follows: A laser beam is focused onto the opposing ends of the conductor strips 10A and 10B of the check pattern 10 to melt the aluminum of the conductor strips 10A and 10B for the purpose of short-circuiting the conductor strips 10A and 10B. Thereafter, the probes of the tester are contacted to the contract pads 10C and 10D, respectively, to measure a resistance between the contact pads 10C and 10D, in order to know whether or not the conductor strips 10A and 10B are still in an open-circuit condition or whether or not the short-circuiting resistance between the contact pads 10C and 10D is large. If the conductor strips 10A and 10B are in an open-circuit condition or if the short-circuiting resistance between the contact pads 10C and 10D is large, this means that the laser beam is weak. In this case, the laser beam is strengthened. In addition, in order to know whether or not the laser beam is too strong, the probes of the tester are contacted to the contact pad 10C or 10D and the semiconductor substrate 1, respectively, to measure a resistance between the check pattern 10 and the semiconductor substrate 1.

Incidentally, if an additional aluminum wiring conductor is formed adjacent to the check pattern mentioned above and is connected integrally with an additional contact pad, whether or not a short-circuiting occurs between the test pattern and the additional wiring conductor, is checked by measuring a resistance between the contact pad 10C or 10D and the additional pad connected to the additional aluminum wiring conductor. Thus, since the check pattern used for determining the optimum condition of the laser beam is formed on the product chip, the precision in conditioning a laser beam splitter becomes high, and therefore, the yield after the trimming can be elevated.

Figure 6A:
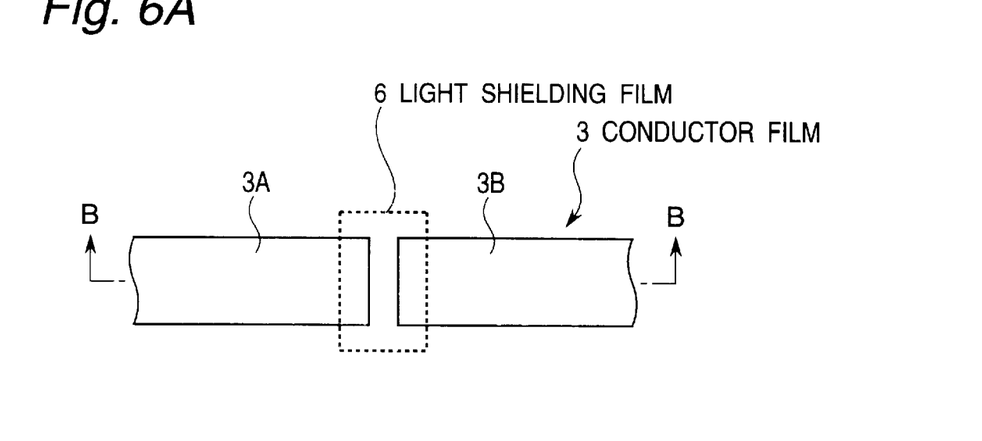
FIG. 6A is a diagrammatic plan view of another embodiment of the make-link type fuse in accordance with the present invention.
Figure 6B:
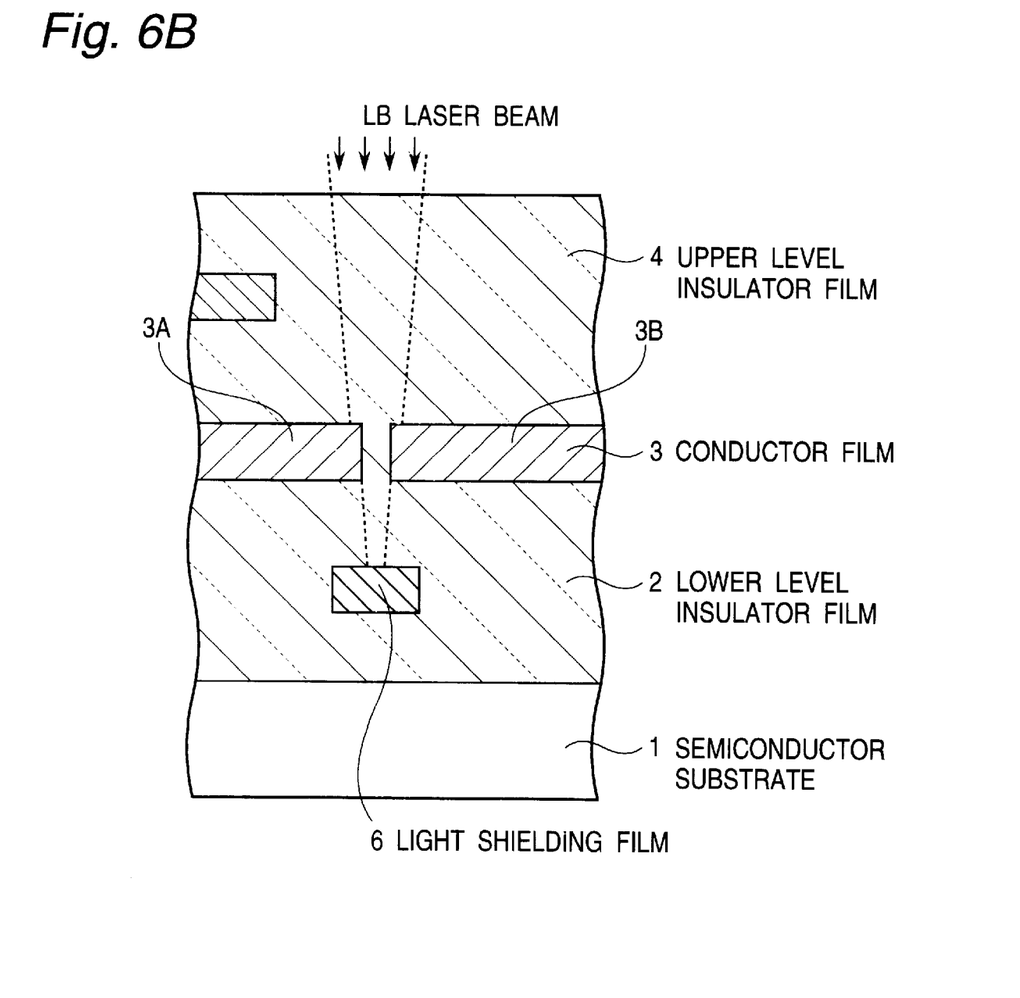
FIG. 6B is a diagrammatic sectional view taken along the line B—B in FIG. 6A.

Referring to FIG. 6A, there is shown a diagrammatic plan view of another embodiment of the make-link type fuse in accordance with the present invention. FIG. 6B is a diagrammatic sectional view taken along the line B—B in FIG. 6A. In FIGS. 6A and 6B, elements similar to those shown in FIGS. 3A to 3C are given the same Reference Numerals, and explanation thereof will be omitted for simplification of description.

As seen from comparison between FIGS. 6A and 6B and FIGS. 3A to 3C, the second embodiment is different from the first embodiment in that the second embodiment includes a light shielding film 6 having a poor laser permability, formed at a position directly under the opposing ends of the pair of conductor strips 3A and 3B. This light shielding film 6 is formed of aluminum, tungsten, polysilicon, amorphous silicon, gold, copper, platinum, titanium or cobalt.

In this second embodiment, the laser beam LB is focused or irradiated from the upper level insulator film 4 to the opposing ends of the conductor strips 3A and 3B, so as to melt the opposing ends of the conductor strips 3A and 3B, and to resultantly short-circuit the opposing ends of the conductor strips 3A and 3B. In this process, the laser beam reaches the lower level insulator film 2 to encroach the lower level insulator film 2. However, since the laser beam is blocked by the light shielding film 6, the laser beam never reaches a position lower than the light shielding film 6, and therefore, the lower level insulator film 2 lower than the light shielding film 6, is prevented from being encroached. Therefore, even if a wiring conductor or a device formed in the semiconductor substrate exists under the lower level insulator film 2, the wiring conductor or the device is never subjected to adverse influence of the laser beam.

Figure 7:
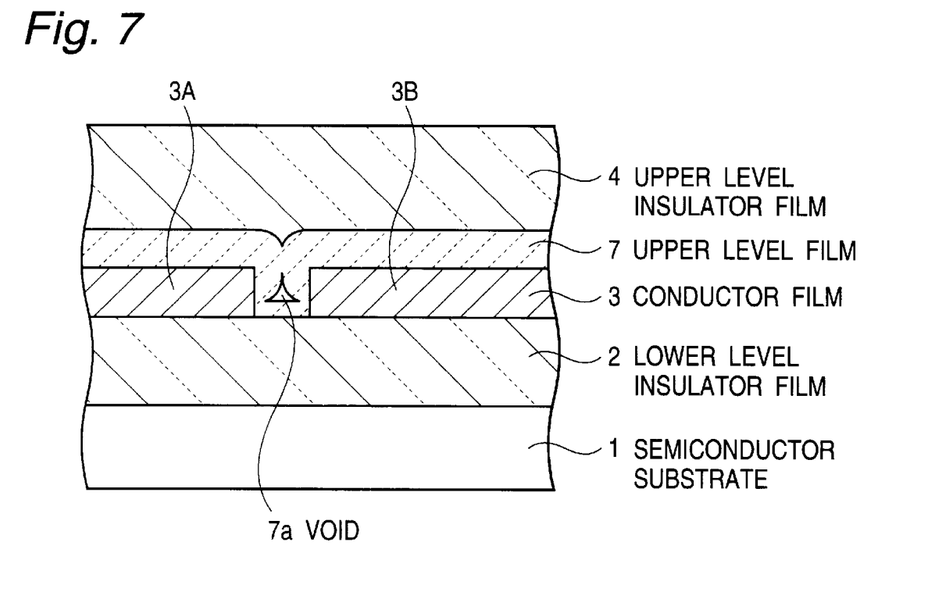
FIG. 7 is a diagrammatic plan view of a modification of the make-link type fuse in accordance with the present invention.

As shown in FIG. 7, an upper layer 7 having a poor coverage, such as a plasma-oxidized film, can be formed to cover the conductor strips 3A and 3B and to fill a gap between the opposing ends of the pair of conductor strips 3A and 3B. In this case, the upper level insulator film 4 is formed on the upper layer 7.

By forming the upper layer 7, a void 7a is created in the upper layer 7 filled in the gap between the opposing ends of the conductor strips 3A and 3B, which form a step in the conductor film 3. Because of this void 7a, it becomes easy to short-circuit the conductor strips 3A and 3B molten by the laser beam. The upper layer 7 can be formed of a film of the glass including BPSG, PSG and NSG, a nitride film, or a SiON film.

Figure 8:
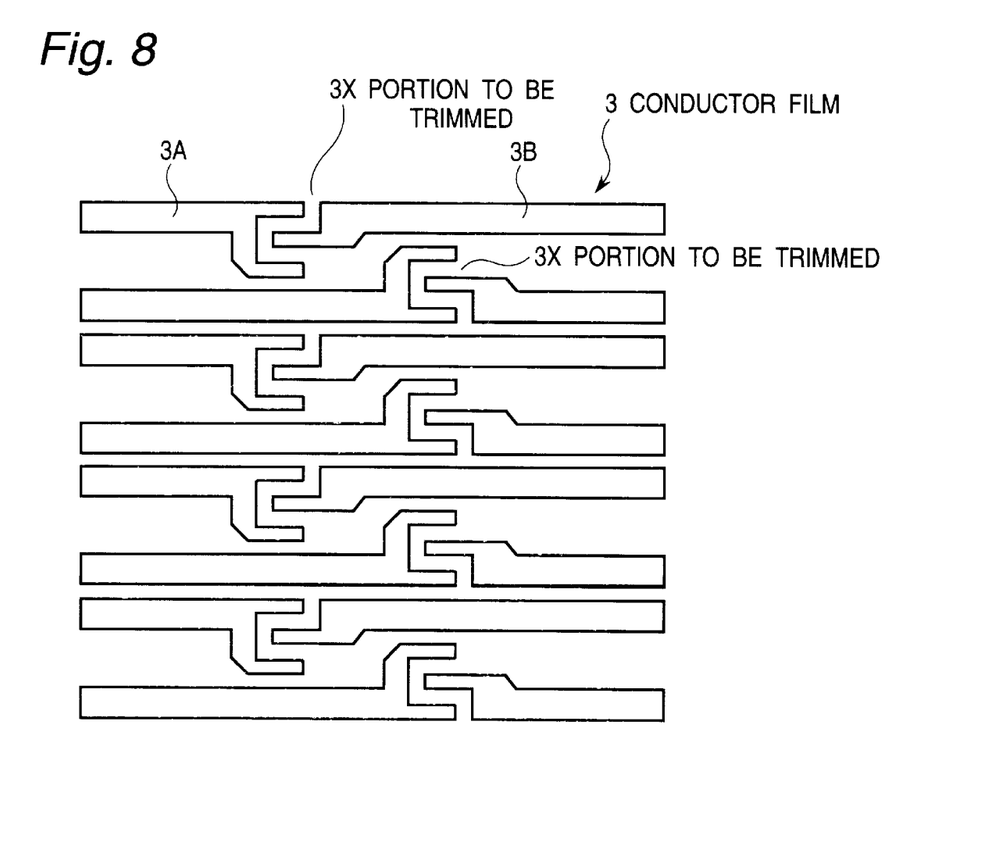
FIG. 8 is a diagrammatic plan view illustrating an example in which a number of fuses are arranged side by side.

When a plurality of pairs of conductor strips are formed side by side on the semiconductor substrate, portions 3X to be trimmed of the plurality of pairs of conductor strips are located in a staggered or zigzag fashion in a plan view, as shown in FIG. 8. When the portions 3X to be trimmed of each pair of conductor strips are formed to have the shape shown in FIG. 4B, even if the portions 3X to be trimmed has the width larger than that of the other portion of the conductor strip, the spacing between adjacent conductor strip pairs arranged side by side can be reduced, so that it becomes possible to elevate the integration density and also the trimming yield. In addition, even if one of adjacent conductor strip pairs is trimmed, the conductor strips of the other conductor strip pair can be prevented from being unintentionally short-circuited by the residue of the trimming of the one conductor strip pair.

As seen from the above, in the laser beam make-link programmable semiconductor device in accordance with the present invention, since the spacing between the conductor strips located to be separated from each other but to oppose to each other so as to form a fuse is smaller than the thickness of the upper level or overlying insulator film, the step for forming the fuse pad and the step for forming a coating layer covering the fuse pad, which were required only for forming the fuse in the prior art, are no longer necessary. Therefore, the manufacture process can be correspondingly simplified, and the manufacturing cost can be also reduced. Furthermore, the laser beam trimming for short-circuiting can be achieved with a laser beam having a reduced energy.

In the laser beam make-link programmable semiconductor device in accordance with the present invention, if the light shielding film is formed at a position directly under the opposing ends of the pair of conductor strips, it is possible to protect the wiring conductor or the device formed under the lower level or underlying insulator film, from the laser beam. Therefore, reliability of the semiconductor device can be elevated.

In addition, if the upper layer having a poor coverage is formed to cover the opposing ends of the pair of conductor strips, the trimming of the conductor strips can be easily carried out with the laser beam having a small energy.

In addition, when a plurality of pairs of conductor strips are formed side by side on the semiconductor substrate, if portions to be trimmed of the plurality of pairs of conductor strips are located in a staggered or zigzag fashion in a plan view, the spacing between adjacent conductor strip pairs arranged side by side can be reduced. As a result, it becomes possible to elevate the integration density and also the trimming yield. Furthermore, even if one of adjacent conductor strip pairs is trimmed, the conductor strips of the other conductor strip pair can be prevented from being unintentionally short-circuited by the residue of the trimming of the one conductor strip pair. Therefore, the trimming yield can be elevated.

The invention has thus been shown and described with reference to the specific embodiments. However, it should be noted that the present invention is in no way limited to the details of the illustrated structures but changes and modifications my be made within the scope of the appended claims.

What is claimed is:

1. A laser beam make-link programmable semiconductor device comprising:
    a lower level insulator film formed on a first plane above a semiconductor substrate;
    a pair of conductor films formed on a second plane on a top side of said lower level insulator film and having opposing ends thereof separated by a predetermined distance within which no conductive material is located; and
    an upper level insulator film substantially transparent to a laser beam, formed on said conductor films and between the opposing ends thereof, a film thickness of said upper level insulator film being greater than the predetermined distance separating the opposing ends of the conductor films.

2. A semiconductor device claims in claim 1, wherein the predetermined distance is within a range of from 0.001 micrometers to less than about 0.5 micrometers.

3. A semiconductor device claimed in claim 1, wherein:
    the lower level insulator film comprises a material selected from the group consisting of borophosphosilicate glass ("BPSG"), phosphosilicate glass ("PSG"), non-doped silicate glass ("NSG"), a nitride film, and a SiON film; and
    the upper level insulator film comprises a material selected from the group consisting of borophosphosilicate glass ("BPSG"), phosphosilicate glass ("PSG"), non-doped silicate glass ("NSG"), a nitride film, and a SiON film.

4. The semiconductor device claimed in claim 1, further comprising a light shielding material located in said lower level insulator film beneath said opposing ends.

5. A laser beam make-link programmable semiconductor device comprising:
    a lower level insulator film formed on a first plane above a semiconductor substrate;
    a pair of conductor films formed on a second plane on a top side of lower level insulator film and having opposing ends thereof;
    an upper level insulator film substantially transparent to a laser beam, formed on said conductor films; and
    a conductive portion conductively joining said opposing ends and having a structure produced by flow of melted portions of said opposing ends and displacement of a portion of the upper insulating film between the opposing ends by said melted portion,
    wherein a predetermined distance within which no conductive material is located separates the opposing ends of the conductor films prior to flow of melted portions of the conductor films, and wherein a thickness of the upper level insulator film is greater than the predetermined distance separating the opposing ends of the conductor films.

6. A semiconductor device claimed in claim 5, wherein the conductor film and conductive portion are completely covered by the upper level insulator film such that the conductor films and conductive portion are not exposed to the atmosphere.

7. A semiconductor device claimed in claim 5, wherein the predetermined distance is within a range of from 0.001 micrometers to less than about 0.5 micrometers.

8. A semiconductor device claimed in claim 5, wherein:

the lower level insulator film comprises a material selected from the group consisting of borophosphosilicate glass ("BPSG"), phosphosilicate glass ("PSG"), non-doped silicate glass ("NSG"), a nitride film, and a SiON film; and the upper level insulator film comprises a material selected from the group consisting of borophosphosilicate glass ("BPSG"), phosphosilicate glass ("PSG"), non-doped silicate glass ("NSG"), a nitride film, and a SiON film.

9. The semiconductor device claimed in claim 5, further comprising a light shielding material located in said lower level insulator film beneath said opposing ends.

* * * * *